(12) United States Patent
Lee

(10) Patent No.: US 10,768,732 B2
(45) Date of Patent: Sep. 8, 2020

(54) TOUCH DISPLAY PANEL AND TOUCH DISPLAY DEVICE

(71) Applicant: LG Display Co., Ltd., Seoul (KR)

(72) Inventor: Yangsik Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 4 days.

(21) Appl. No.: 16/170,636

(22) Filed: Oct. 25, 2018

(65) Prior Publication Data

US 2019/0121479 A1 Apr. 25, 2019

(30) Foreign Application Priority Data

Oct. 25, 2017 (KR) .......................... 10-2017-0139298

(51) Int. Cl.

| G06F 3/041 | (2006.01) |
|---|---|
| G06F 3/044 | (2006.01) |
| H01L 51/52 | (2006.01) |
| G02F 1/1333 | (2006.01) |
| H01L 27/32 | (2006.01) |

(52) U.S. Cl.
CPC ............ G06F 3/0412 (2013.01); G06F 3/041 (2013.01); G06F 3/044 (2013.01); *G02F 1/13338* (2013.01); *G06F 2203/04112* (2013.01); *H01L 27/322* (2013.01); *H01L 27/323* (2013.01); *H01L 51/5253* (2013.01); *H01L 51/5284* (2013.01)

(58) Field of Classification Search
CPC ............. G06F 3/0412; G06F 3/044; G06F 2203/04112; G06F 3/041; H01L 27/323; H01L 51/5253; G02F 1/13338
See application file for complete search history.

(56) References Cited

U.S. PATENT DOCUMENTS

| 5,717,556 A | 2/1998 | Yanagida | |
| 8,629,842 B2* | 1/2014 | Jang ...................... | G06F 3/0412 345/173 |
| 2014/0368757 A1* | 12/2014 | Chen .................. | H03K 17/9622 349/12 |
| 2015/0177880 A1* | 6/2015 | Shin ...................... | G06F 3/0412 345/174 |

(Continued)

FOREIGN PATENT DOCUMENTS

| CN | 106716642 A | 5/2017 |
| JP | H08-298364 A | 11/1996 |
| WO | 2016/057231 A1 | 4/2016 |

OTHER PUBLICATIONS

Extended European Search Report issued in corresponding European Patent Application No. 18202408.3 dated Jan. 1, 2019.

*Primary Examiner* — Temesghen Ghebretinsae
*Assistant Examiner* — Karin Kiyabu
(74) *Attorney, Agent, or Firm* — Morgan, Lewis & Bockius LLP

(57) ABSTRACT

A touch display panel and a touch display device are provided. A touch display device includes: an active area, a non-active area outside the active area, the non-active area including a bent area, a plurality of touch electrodes in the active area, a first insulating layer in the bent area, the first insulating layer including: a first region having a first height, and a second region having a second height lower than the first height, and a first touch line in the second region of the first insulating layer in the bent area in the non-active area.

13 Claims, 12 Drawing Sheets

(56) References Cited

U.S. PATENT DOCUMENTS

| | | | |
|---|---|---|---|
| 2015/0179728 A1* | 6/2015 | Kwon | H01L 27/3276 257/40 |
| 2015/0382446 A1 | 12/2015 | Kwon et al. | |
| 2016/0035812 A1* | 2/2016 | Kwon | H01L 27/3276 257/40 |
| 2016/0093644 A1 | 3/2016 | Ki et al. | |
| 2016/0103534 A1 | 4/2016 | Zhang et al. | |
| 2016/0179229 A1* | 6/2016 | Ahn | G06F 3/041 345/173 |
| 2016/0291784 A1* | 10/2016 | Zhai | G06F 3/0416 |
| 2017/0075464 A1 | 3/2017 | Ahn | |
| 2018/0059855 A1* | 3/2018 | Gwon | G06F 3/0412 |
| 2018/0130856 A1* | 5/2018 | Kim | H01L 51/0097 |
| 2018/0182291 A1* | 6/2018 | Hanari | H01L 27/3276 |
| 2019/0129567 A1* | 5/2019 | Rhe | G06F 3/0416 |

* cited by examiner

TOUCH DISPLAY PANEL AND TOUCH DISPLAY DEVICE

CROSS-REFERENCE TO RELATED APPLICATION(S)

This application claims the benefit of and priority to Korean Patent Application No. 10-2017-0139298, filed on Oct. 25, 2017, the entirety of which is hereby incorporated by reference.

BACKGROUND

1. Technical Field

The present disclosure relates to a touch display panel and a touch display device.

2. Discussion of the Related Art

As an information society develops, demand for a display device for displaying images is increasing, and various types of display devices, such as a liquid crystal display device, a plasma display device, and an organic light-emitting display device, are being utilized. To provide more various functions to a user, such display devices provide functions of recognizing a user's touch on a display panel and performing an input process based on the recognized touch.

For example, to sense a user's touch on a display panel, a plurality of touch electrodes and touch lines connecting the touch electrodes and a driving circuit to each other are disposed on the display panel. In addition, by sensing a change in capacitance caused by a user's touch on the display panel, the presence or absence of the user's touch on the display panel, a touch position, or the like can be sensed.

The display panel capable of recognizing such touch may have various structures according to the display panel, and may include a bent area in which an outer area of the display panel is bent. When the display panel includes a bent area as described above, there is a problem in that the touch lines disposed in the bent area are arranged in a bent form, like the bent area, and may be easily cracked when arranged in a bent form.

SUMMARY

Accordingly, the present disclosure is directed to a touch display panel and a touch display device that substantially obviate one or more of the issues due to limitations and disadvantages of the related art.

An aspect of the disclosure is to provide a touch display panel and a touch display device that enable touch recognition in a display panel structure including a bent area that is bent in an outer area of a display panel.

Another aspect of the disclosure is to provide a touch display panel and a touch display device having a structure, in the display panel including a bent area, capable of preventing cracking of metal lines, such as data lines and touch lines, in the bent area.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a touch display device, including: an active area, a non-active area outside the active area, the non-active area including a bent area, a plurality of touch electrodes in the active area, a first insulating layer in the bent area, the first insulating layer including: a first region having a first height, and a second region having a second height lower than the first height, and a first touch line in the second region of the first insulating layer in the bent area in the non-active area.

In another aspect, there is provided a touch display panel, including: an active area including a plurality of touch electrodes, a non-active area outside the active area, the non-active area including a bent area, an insulating layer in the bent area, the insulating layer including: a first region having a first height, and a second region having a second height lower than the first height, a metal wire in the second region of the insulating layer, and a protective layer on the insulating layer and the metal wire.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
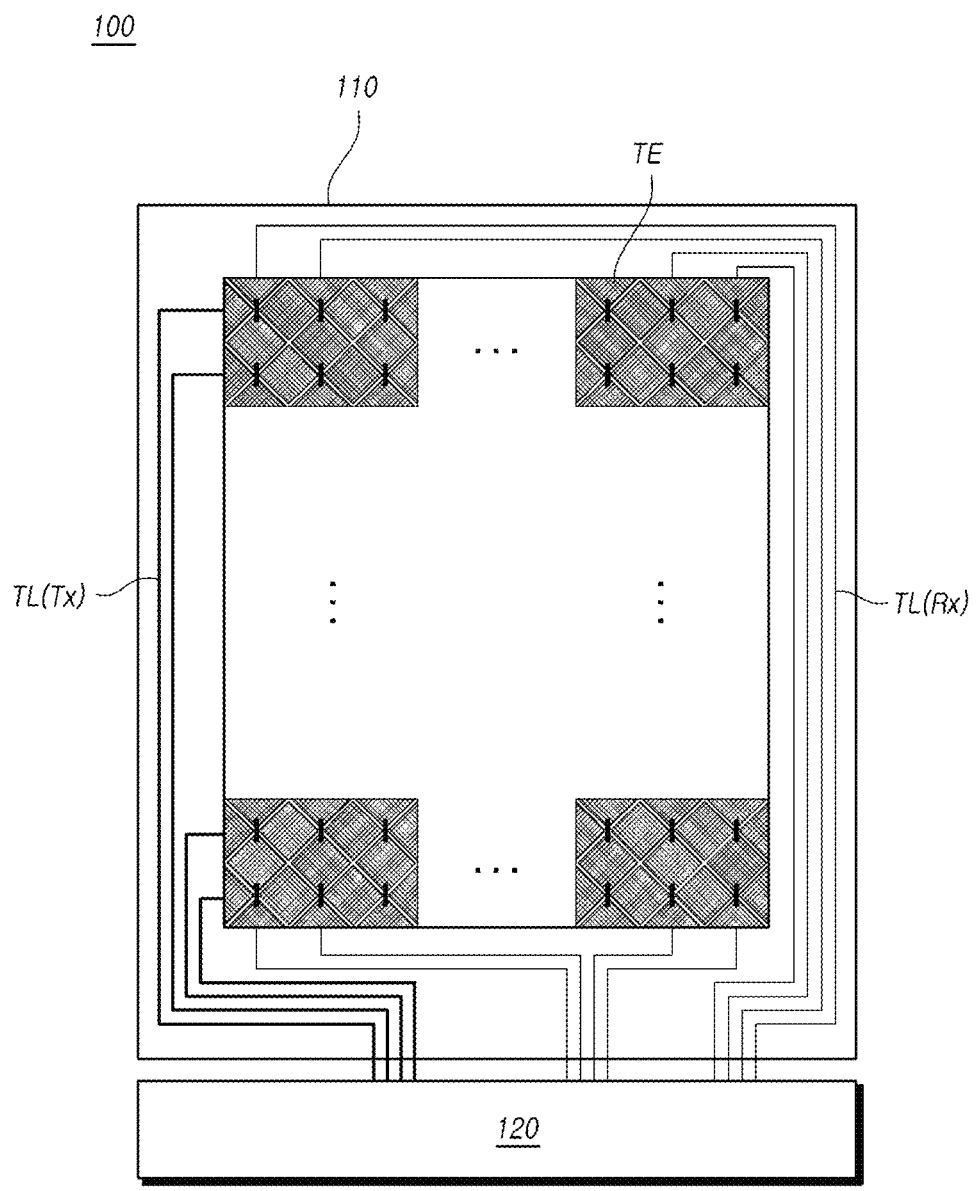
FIG. 1 illustrates a configuration of a touch display device according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Figure 2:
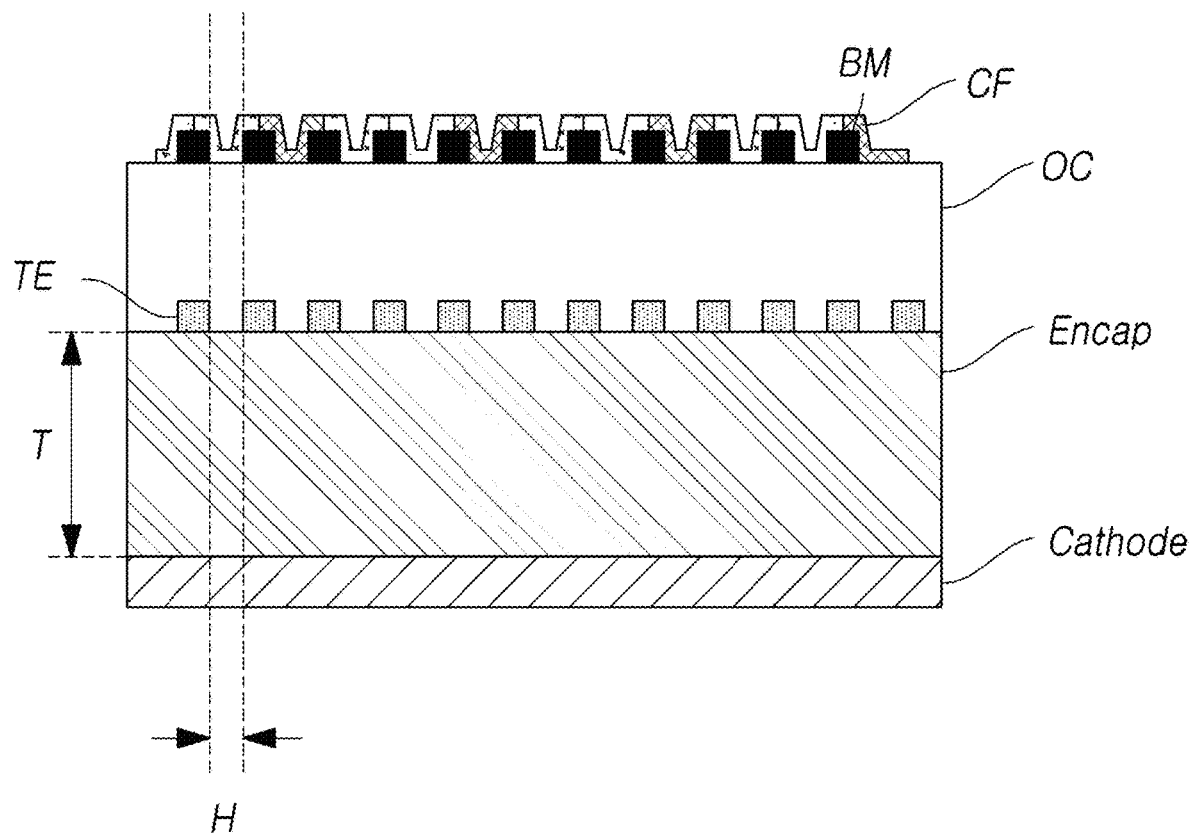
FIGS. 2 and 3 illustrate examples of a sectional structure of a touch display device according to an example embodiment of the present disclosure.
Figure 3:
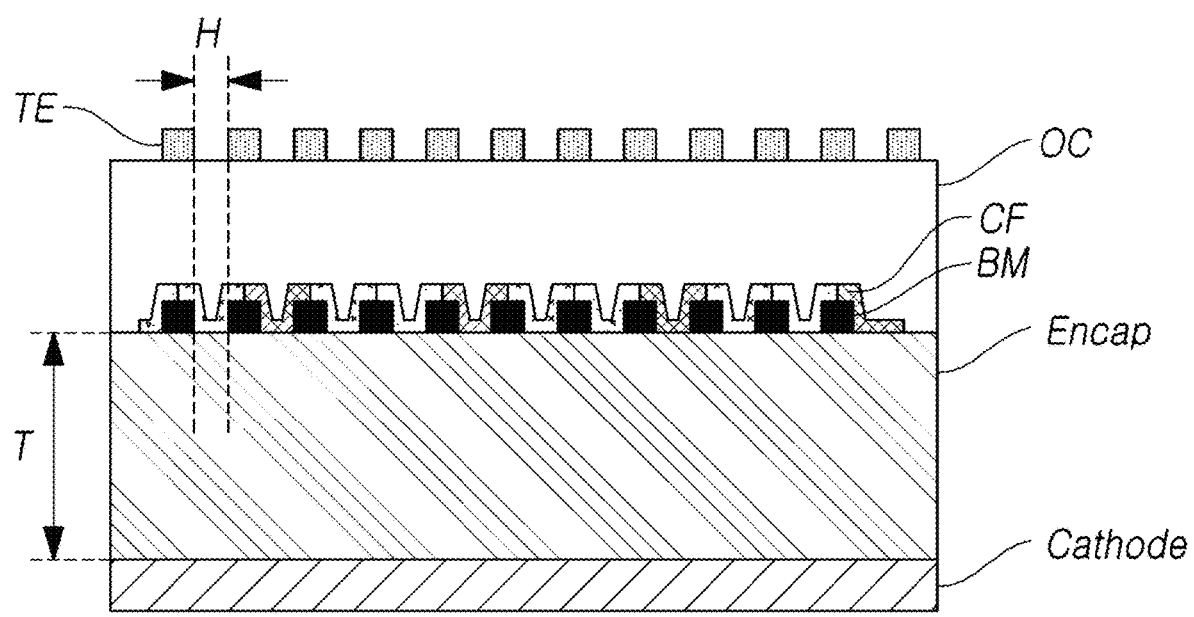

FIG. 1 illustrates a configuration of a touch display device according to an example embodiment of the present disclosure. FIGS. 2 and 3 illustrate examples of a sectional structure of a touch display device according to an example embodiment of the present disclosure.

With reference to FIG. 1, a touch display device 100 may include a touch display panel 110 in which a plurality of touch electrodes TE and a plurality of touch lines TL are disposed, and a driving circuit 120 configured to output a touch driving signal to the touch electrodes TE and to sense a touch based on a touch-sensing signal received from the touch electrodes TE. The touch display panel 110 may be divided into an active area A/A (see FIG. 4) having a plurality of sub-pixels arranged therein and configured to display an image, and a non-active area N/A (see FIG. 4) located outside the active area A/A and having wires or the like arranged thereon to transmit a signal applied to the sub-pixels.

In the active area A/A of the touch display panel 110, gate lines and data lines may be arranged to intersect each other, and the sub-pixels may be arranged in areas where the gate lines and the data lines intersect each other. The subpixels arranged in the active area A/A may express gradations according to data voltage supplied through the data lines in accordance with the timing of scan signals applied to the gate lines, so that the images can be displayed through the active area A/A.

In addition to the configuration for driving the display, a plurality of touch electrodes TE for sensing a user's touch may be arranged in the active area A/A. When the touch display device 100 is a liquid crystal display device, common electrodes arranged in the active area A/A may be used as touch electrodes TE. When the touch display device 100 is an organic light-emitting display device, touch electrodes TE may be on an encapsulation layer, but embodiments of the present disclosure are not limited thereto.

For example, briefly explaining the structure in which touch electrodes TE are arranged when the touch display device 100 is an organic light-emitting display device, with reference to FIGS. 2 and 3, the touch electrodes TE may be between the encapsulation layer Encap and a cover of the touch display panel 110. That is, a configuration for touch sensing, such as the touch electrodes TE and the touch lines TL, may be on the encapsulation layer Encap.

For example, a cathode of an organic light-emitting diode OLED may be under the encapsulation layer Encap, and the touch electrodes TE may be on the encapsulation layer Encap to be spaced apart from the cathode. For example, the thickness T of the encapsulation layer Encap may be 5 μm or more.

By designing the thickness T of the encapsulation layer Encap to be a particular value or more, it may be possible to reduce parasitic capacitance formed between the cathode of the OLED and the touch electrodes TE. Thus, it may be possible to reduce or prevent the touch sensing sensitivity from deteriorating due to the parasitic capacitance.

When the touch electrodes TE are of a mesh type including holes H, the holes H included in the touch electrodes TE may be located to correspond to the light-emitting portions of the sub-pixels. Therefore, the holes H of the touch electrodes TE may correspond to color filters CF, and when the color filters CF are required, for example, when using a white OLED, it may be possible to provide a touch display device 100 having excellent light-emitting performance by making the positions of the color filters CF correspond to the positions of the holes H of the touch electrodes TE.

The vertical positions of the touch electrodes TE and the color filters CF may be variously designed. For example, as illustrated in FIG. 2, the color filters CF and a black matrix BM may be on the touch electrodes TE. In addition, the color filters CF and the black matrix BM may be on an overcoat layer OC on the touch electrodes TE.

As another example, as illustrated in FIG. 3, the color filters CF and the black matrix BM may be under the touch electrodes TE. At this time, the touch electrodes TE may be on the overcoat layer OC disposed on the color filters CF and the black matrix BM. That is, the touch electrodes TE and the color filter CF may be designed to have an optimal positional relationship in consideration of touch performance and display performance.

In addition, by providing a structure in which the touch electrodes TE are on the encapsulation layer Encap, it may be possible to provide an organic light-emitting display device that overcomes a problem that it is difficult to form touch electrodes TE, which may be made of a metallic material, inside a panel, and that has excellent display performance and touch performance. In this way, the plurality of touch electrodes TE inside the touch display panel 110 may be arranged in a structure in which the touch electrodes may be uniformly separated from each other in the active area A/A, and may be electrically connected to the driving circuit 120 through the touch lines TL.

The touch electrodes TE and the touch lines TL may be arranged in various structures, depending on a method of sensing a touch. A case in which touch sensing is performed by the mutual capacitive sensing method is described by way of example, but embodiments of the present disclosure are not limited thereto.

The plurality of touch electrodes TE may include transmission (Tx) electrodes each configured to receive a touch driving signal output from the driving circuit 120 and reception (Rx) electrodes each configured to transmit the touch sensing signal to the driving circuit. In addition, the plurality of touch lines TL may include Tx touch lines TL(Tx) connected to the Tx electrodes of the plurality of touch electrodes TE, and Rx touch lines TL(Rx) connected to the Rx electrodes of the plurality of touch electrodes TE. For example, as illustrated in FIG. 1, the Tx touch lines TL(Tx) may be connected to the Tx electrodes of the touch electrodes TE in a horizontal direction, and the Rx touch lines TL(Rx) may be connected to the Rx electrodes of the touch electrodes TE in a vertical direction.

The driving circuit 120 may apply a touch driving signal to the Tx electrodes through the Tx touch lines TL(Tx) in a time period in which a touch is sensed, and may receive a touch sensing signal from the Rx electrodes through the Rx touch lines TL(Rx), thereby sensing the presence or absence of a user's touch on the touch display panel 110 and a touch position. Thus, the embodiments of the present disclosure may provide a touch display device 100 in which the touch electrodes TE and the touch lines TL are arranged on a display panel, which may enable a user's touch on the display panel to be recognized.

In the touch display device 100, the touch display panel 110 may have various shapes. For example, the outer area of the touch display panel 110 may include a bent area.

Figure 4:
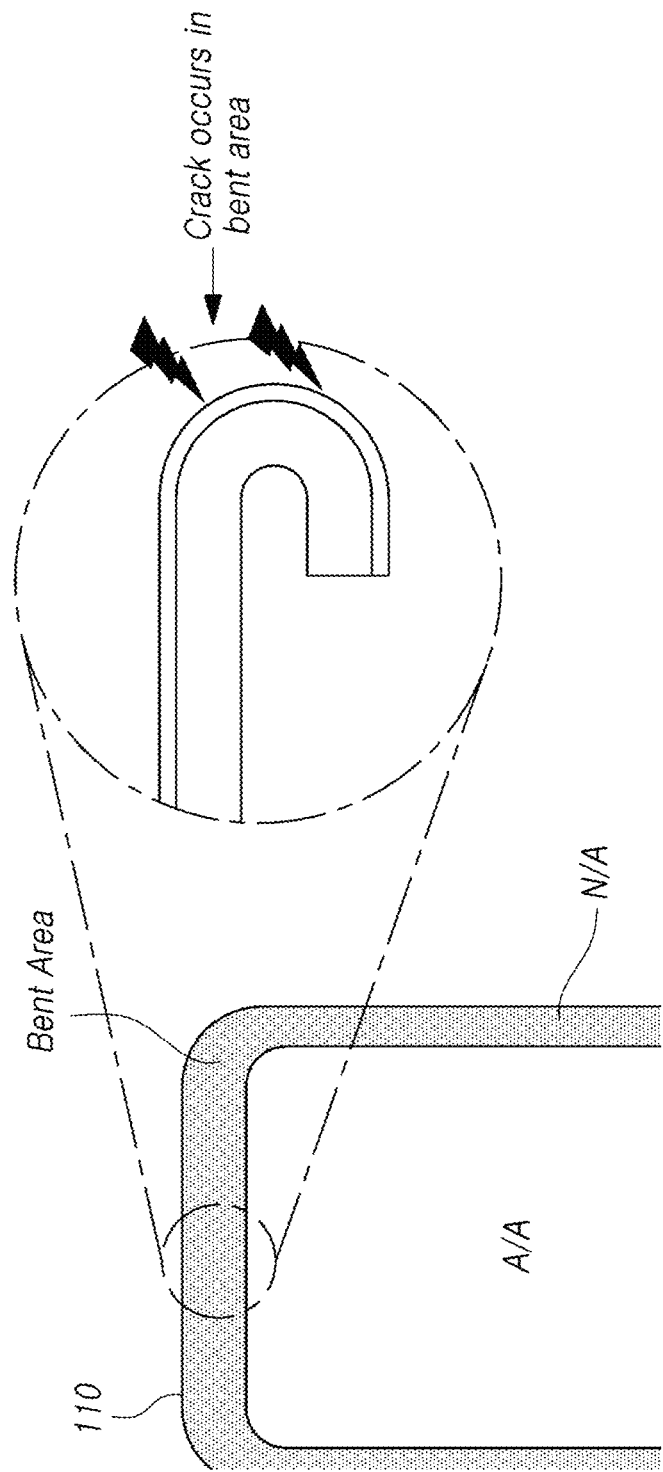
FIG. 4 illustrates an example of a structure in which a touch display device according to an example embodiment of the present disclosure includes a bent area.

FIG. 4 illustrates an example of a structure in which a touch display device according to an example embodiment of the present disclosure includes a bent area.

In FIG. 4, a touch display device 100 may include a bent area in the outer area thereof. With reference to FIG. 4, the touch display panel 110 of the touch display device 100 may include an active area A/A in which sub-pixels and touch electrodes TE are arranged, and a non-active area N/A located outside the active area A/A.

The non-active area N/A, which may be an outer area of the touch display panel 110, may include a bent area in which the touch display panel is at least partially bent. Touch lines TL, connecting the touch electrodes TE disposed in the active area A/A and a driving circuit 120 to each other, may be disposed in the bent area.

The touch line TL may connect the touch electrodes TE and the driving circuit 120, and may be arranged along the bent shape of the bent area. That is, the touch lines TL may be arranged along the bent face of the bent area. Therefore, the touch lines TL may be cracked because the touch lines TL in the bent area may be bent according to the shape of the bent area. The touch display device 100 may provide a structure capable of reducing or preventing the touch lines TL from being cracked due to bending of the touch lines in the bent area.

Figure 5:
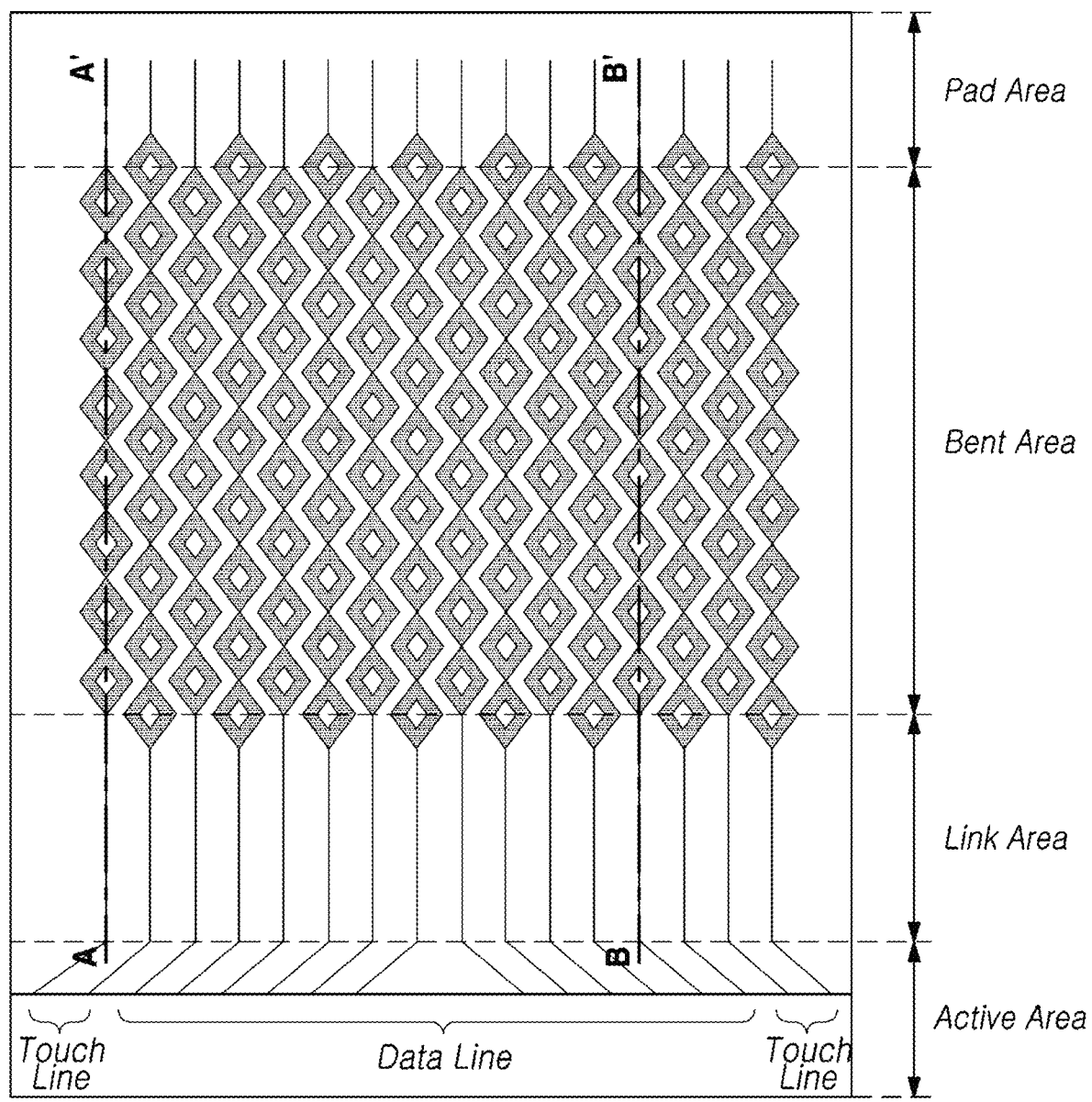
FIG. 5 illustrates an example of a metal wire structure in a bent area in a touch display device according to an example embodiment of the present disclosure.

FIG. 5 illustrates an example of a metal wire structure in a bent area in a touch display device according to an example embodiment of the present disclosure.

FIG. 5 illustrates an example of a structure of touch lines TL in a bent area of a touch display panel 110 in a touch display device 100. FIG. 5 is a sectional view illustrating a state in which the bent area of the touch display panel 110 is unfolded.

With reference to FIG. 5, in the touch panel display device 110, a link area, in which touch lines TL to be connected to touch electrodes TE may be arranged, may be disposed outside an active area A/A where the touch electrodes TE may be arranged. A bent area, which may be formed by bending the touch display panel 110, may be located in a portion adjacent to the link area. A pad area, where the touch lines TL connected to a driving circuit 120 may be arranged, may be located in a portion adjacent to the bent area. That is, in the link area, the bent area, and the pad area located outside the active area A/A, touch lines TL may connect the touch electrodes TE and the driving circuit 120 arranged in the active area A/A.

For example, because the bent area is bent, the touch lines TL in the bent area may be cracked. The touch display device 100 according to embodiments of the present disclosure may provide a structure capable of reducing or minimizing occurrence of cracks in the touch lines TL in the bent area, even if the bent area is bent.

For example, as illustrated in FIG. 5, the touch lines TL in the link area and the pad area may be arranged in a linear form. Then, the touch lines TL in the bent area may be arranged in a direction oblique to the direction in which the bent area is bent.

For example, in the bent area, the touch lines TL may be arranged in a structure in which a plurality of rhombic patterns, in which the touch lines may be arranged in a first direction that is oblique to the bent direction and a second direction that intersects the first direction, may be connected. That is, each touch line TL may include first portions and second portions having a zigzag shape, and the first portions and the second portions may be crossed to form one touch line TL.

By arranging the touch lines TL in a structure in which a plurality of rhombic patterns are connected, even if the touch lines TL are bent in the bent area in accordance with the shape of the bent area, the force received by the touch lines TL can be dispersed in a direction oblique to the bent direction of the bent area. Accordingly, it may be possible to reduce the occurrence of cracks in the touch lines TL by dispersing the force received in the bent direction of the touch lines TL disposed in the bent area. In addition, embodiments of the present disclosure may provide a structure resistant to cracking by arranging the touch lines TL, disposed in the bent area, in a stepped structure.

Figure 6:
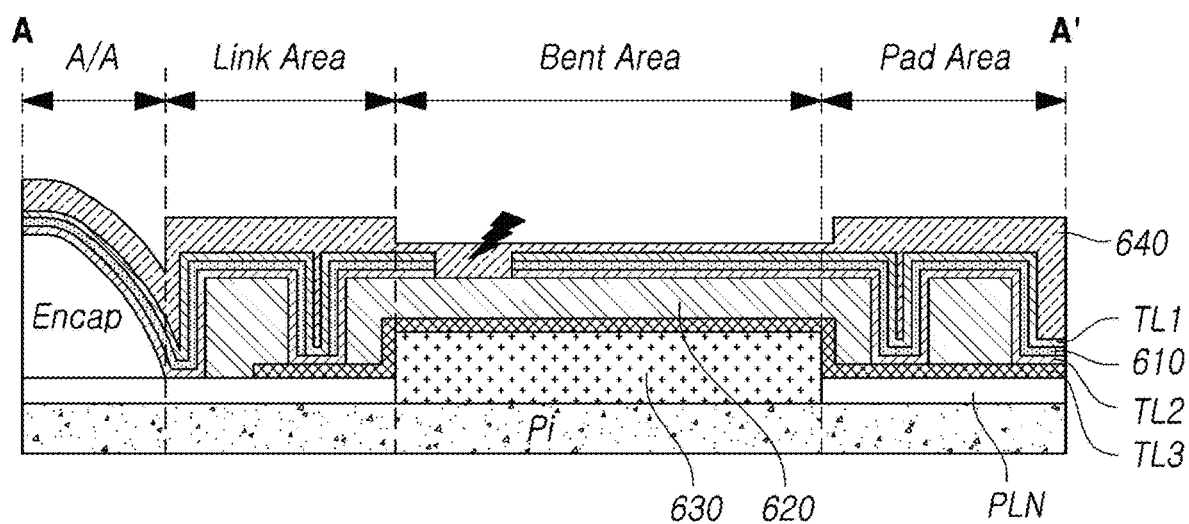
FIG. 6 illustrates an example of a section taken along line A-A' in FIG. 5.
Figure 7:
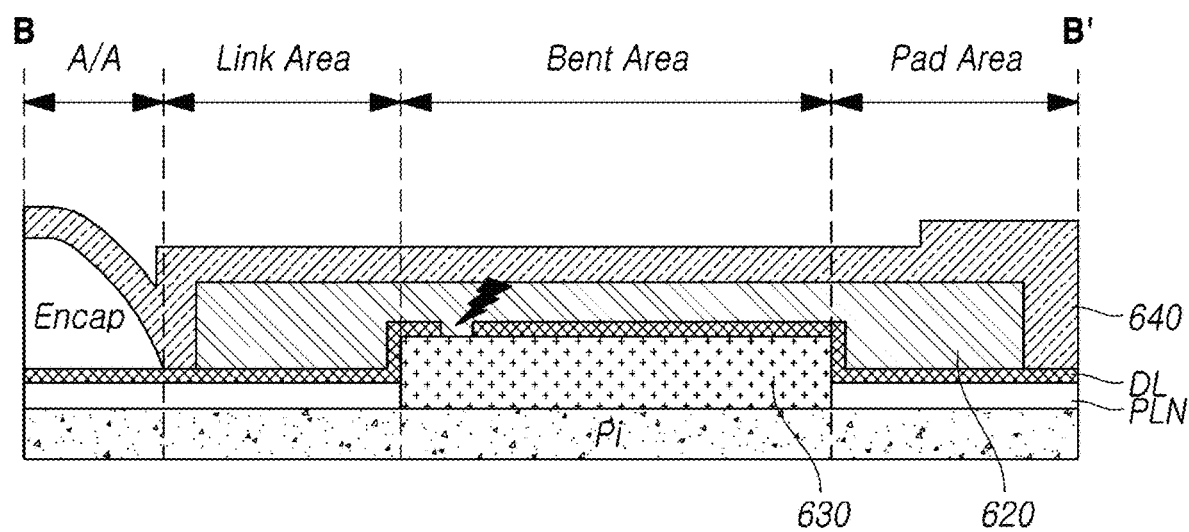
FIG. 7 illustrates an example of a section taken along line B-B' in FIG. 5.

FIG. 6 illustrates an example of a section taken along line A-A' in FIG. 5. FIG. 7 illustrates an example of a section taken along line B-B' in FIG. 5.

FIGS. 6 and 7 illustrate sectional structures of a metal wire in the bent area of the touch display device 100. FIG. 6 illustrates an example of a section of line A-A' in FIG. 5, and FIG. 7 illustrates an example of a section of line B-B' in FIG. 5.

With reference to FIG. 6, in the touch display device 100, a first touch line TL1 may be in a non-active area N/A, a first insulating layer 610 may be below the first second touch line TL1, and a second touch line TL2 may be under the first insulating layer 610. For example, the first insulating layer 610 may be referred to as a "touch insulating layer." By arranging the touch lines TL in a double wiring structure of the first touch line TL1 and the second touch line TL2, touch sensing sensitivity can be improved.

A second insulating layer 620 may be below the second touch line TL2, a third touch line TL3 may be below the second insulating layer 620, and a third insulating layer 630 may be under the third touch line TL3. For example, the third touch line TL3 may be on the same layer as the layer where a data line DL is disposed. A protective layer 640 may be on the first touch line TL1. A lower layer Pi may include, for example, polyimide. A planarization layer PLN may be on the lower layer Pi.

The first touch line TL1 and the second touch line TL2 may be on the second insulating layer 620 in the non-active area N/A and on an encapsulation layer Encap in the active area A/A, and may be connected to a plurality of touch electrodes TE in the active area A/A. The first touch line TL1 and the second touch line TL2 may be bent in the same direction as the bent direction of the bent area in the non-active area N/A, and may have a stepped structure.

For example, as illustrated in FIG. 6, the first touch line TL1 and the second touch line TL2 may be arranged in a bent shape along a hole formed in the second insulating layer 620 in the pad area. In addition, the first touch line TL1 and the second touch line TL2 may be arranged in a bent shape along a hole formed in the second insulating layer 620 in the link area. The first touch line TL1 and the second touch line TL2 may be electrically connected to each other at one or more points in the non-active area N/A, and the second touch line TL2 and the third touch line TL3 may also be electrically connected at one or more points.

When the first touch line TL1 and the second touch line TL2 are arranged in a bent shape along the hole formed in the second insulating layer 620 in the pad area and the link area, the first touch line TL1 and the second touch line TL2, which may be in the bent area, may be arranged in a bent shape similar to the bent shape of the bent area. Therefore, even if the bent area is bent, when the first touch line TL1 and the second touch line TL2 have a bent shape like the bent area, a structure resistant against bending may be provided.

The structure of the touch lines TL may also be applied to the data lines DL in the bent area. With reference to FIG. 7, the data line DL may be between the second insulating layer 620 and the third insulating layer 630 in the non-active area N/A. The third insulating layer 630 may be only in the bent area, and may be higher than the lower face of the second insulating layer 620 in an area other than the bent area.

Thus, the data line DL may be bent in the bent area similarly to the bent shape of the bent area. This may make it possible to reduce the occurrence of cracks in the data line DL, even if the bent area is bent. However, even if the first touch line TL1, the second touch line TL2, and the data line DL have a similar structure to that of the bent area, the touch lines TL or the data line DL in the bent area may be cracked. Embodiments of the present disclosure may provide a metal wire structure that is more resistant to cracking through a structure in which a pattern is formed in an insulating layer between metal wires in the bent area.

Figure 8:
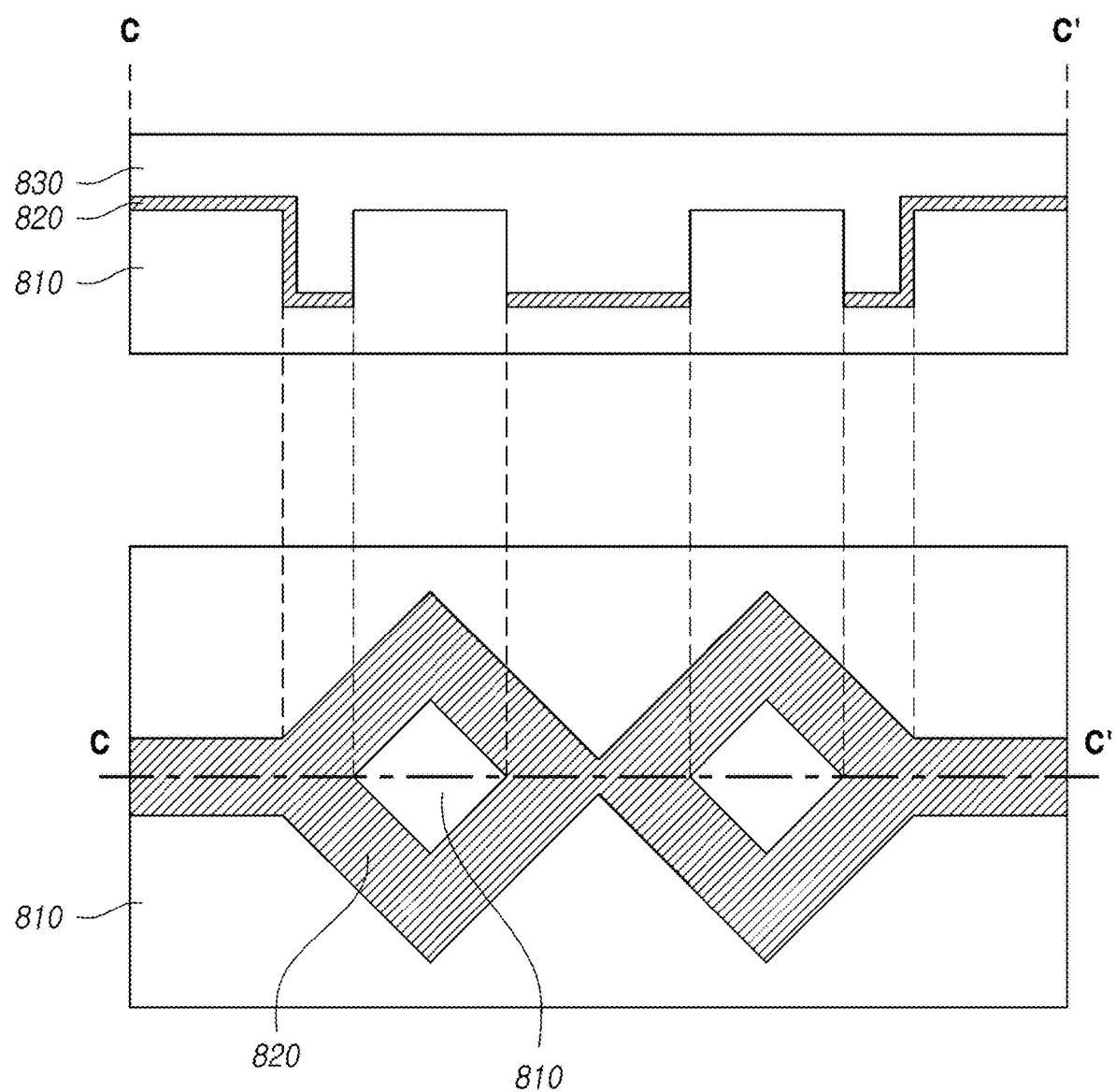
FIG. 8 illustrates an example of an overall structure in which a metal wire is disposed in a bent area in a touch display device according to an example embodiment of the present disclosure.

FIG. 8 illustrates an example of an overall structure in which a metal wire is disposed in a bent area in a touch display device according to an example embodiment of the present disclosure.

FIG. 8 illustrates a schematic structure of an insulating layer 810 and a metal wire 820 in a bent area in a touch display device 100. With reference to FIG. 8, a metal wire 820 may be on the insulating layer 810, and a protective layer 830 may be on the metal wire 820.

For example, the insulating layer 810 may include a first region having a first height and a second region having a second height. That is, by forming a pattern on the insulating layer 810, it may be possible to form a second region having the second height lower than the first height. The metal wire 820 may be in a second region of the insulating layer 810. The thickness of the metal wire 820 in the second region may correspond to a difference between the first height and the second height, or may be smaller than the difference between the first height and the second height.

When the metal wire 820 is inside the pattern formed on the insulating layer 810, the insulating layer 810 may hold the metal wire 820, even if the metal wire 820 is bent in the bent area, thereby reducing the occurrence of cracks in the metal wire 820. That is, the structure illustrated in the examples of FIGS. 6 and 7 may provide a structure resistant to cracking through the structure of the touch lines TL and the data line DL in the bent area, and the structure illustrated in FIG. 8 may provide a structure that is more resistant to cracking through the structure in which the pattern formed in the insulating layer 810 holds the metal wire 820.

Figure 9:
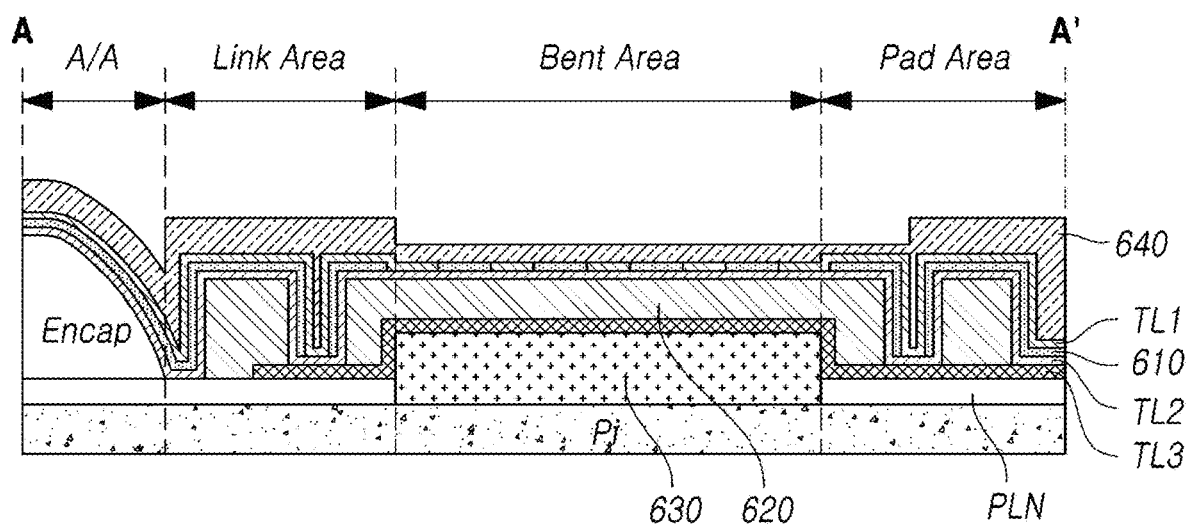
FIGS. 9 to 11 illustrate examples of a case in which the structure of FIG. 8 is applied to the section of line A-A' in FIG. 5.
Figure 10:
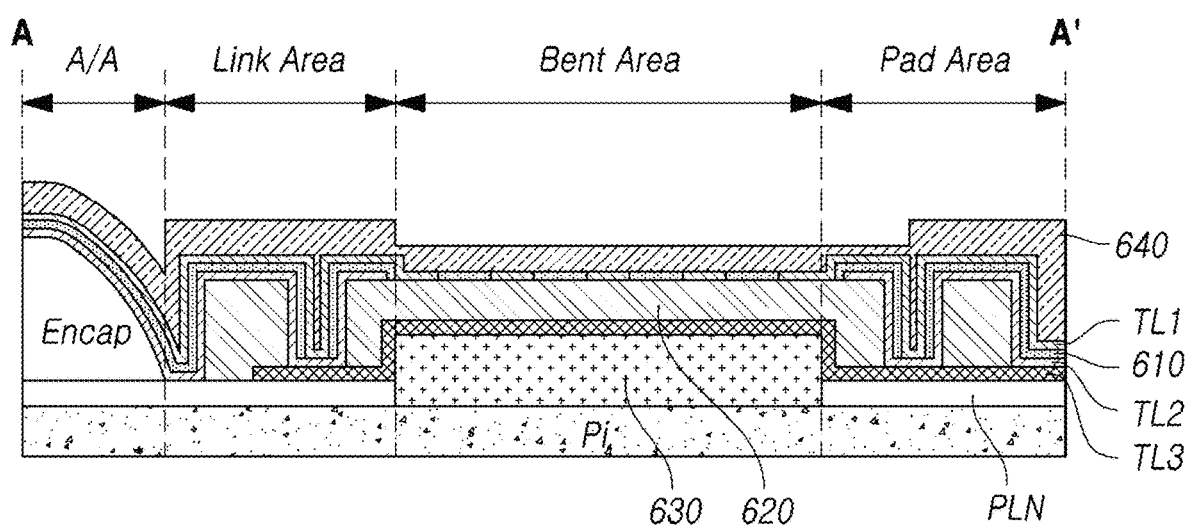
Figure 11:
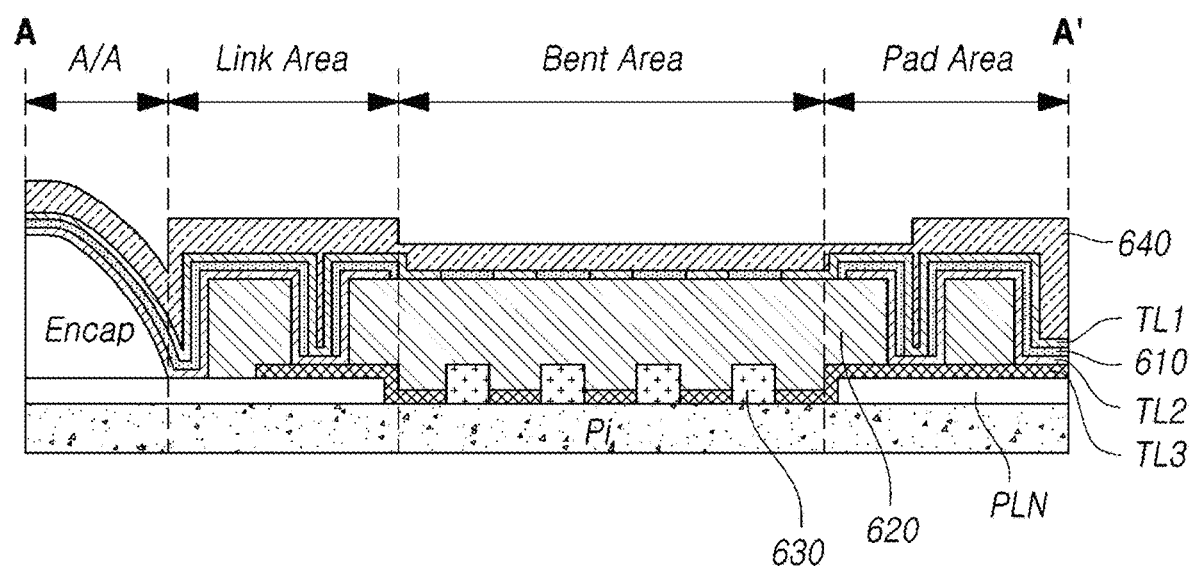

FIGS. 9 to 11 illustrate examples of a case in which the structure of FIG. 8 is applied to the section of line A-A' in FIG. 5.

In FIGS. 9 to 11, the structure of FIG. 8 is applied to the structure of the touch lines TL illustrated in FIG. 5. With reference to FIG. 9, a first insulating layer 610 may be under a first touch line TL1, and a second touch line TL2 may be under the first insulating layer 610. A second insulating layer 620 and a third touch line TL3 may be below the second touch line TL2, and a third insulating layer 630 may be under the third touch line TL3. The first touch line TL1, the second touch line TL2, and the third touch line TL3 may be arranged in a structure like the bent shape of the bent area.

For example, the first insulating layer 610 below the first touch line TL1 may include a first region having a first height, and a second region having a second height lower than the first height. In addition, the second region may be an opened area.

The first touch line TL1 may be in the second region having the second height lower than the first height in the first insulating layer 610. That is, the first touch line TL1 may be in the non-active area N/A in a structure similar to the bent shape of the bent area. In the bent area, the first touch line TL1 may be disposed in a pattern formed in the first insulating layer 610. The thickness of the first touch line TL1 may correspond to a difference between the first height and the second height, or may be smaller than the difference between the first height and the second height.

In addition, when the second region of the first insulating layer 610 is not an opened area, the first touch line TL1 may be in the state of being insulated from the second touch line TL2 in the bent area. When the second region is an opened area, the first touch line TL1 may be in the state of being electrically connected to the second touch line TL2 in the bent area.

Therefore, the first touch line TL1 may be disposed in the pattern formed in the first insulating layer 610, and the thickness of the first touch line TL1 and the connection relation between the first touch line TL1 and the second touch line TL2 may be variously configured. When the first touch line TL1 in the bent area is disposed in the pattern formed in the first insulating layer 610, it may be possible to provide a structure resistant to cracking through the structure in which the first touch line TL1 is held by the first insulating layer 610, even if the first touch line TL1 is bent.

FIG. 10 illustrates another example of the structure of the first touch line TL1 and the second touch line TL2 in the bent area. With reference to FIG. 10, in the non-active area N/A, the first insulating layer 610 may be under the first touch line TL1, and the second touch line TL2 may be under the first insulating layer 610. In addition, in the bent area, the first insulating layer 610 may include a first region having a first height, and a second region having a second height lower than the first height.

The first touch line TL1 may be in the second region of the first insulating layer 610 in the bent area. For example, the second touch line TL2 may not be disposed in the bent area. That is, only the first layer 610 having a pattern formed therein and the first line TL1 located in the pattern of the first insulating layer 610 may be in the bent area.

Because the first touch line TL1 and the second touch line TL2 may be electrically connected at one or more points in an area, other than the bent area in the non-active region N/A, only the first touch line TL1 may be disposed in the bent area. When the first touch line TL1 is disposed in the pattern formed in the first insulating layer 610 in the bent area, the first insulating layer 610 may hold the first touch line TL1 so that a structure resistant to cracking may be provided, even if the bent area is bent. The structure, in which a pattern may be formed on the first insulating layer 610 to hold the first touch line TL1, may also be applied to the second insulating layer 620 or the third insulating layer 620 located below the first insulating layer 610.

FIG. 11 illustrates an example of the structure in which a pattern is formed in the second insulating layer 630 in a touch display device 100. With reference to FIG. 11, the first insulating layer may be under the first touch line TL1, and the second touch line TL2 may be under the first insulating layer 610. In the bent area, the first insulating layer 610 may include a first region having a first height, and a second region having a second height lower than the first height.

The first touch line TL1 may be in the second region of the first insulating layer 610 in the bent area, and the second touch line TL2 may not be in the bent area. In the bent area, the second insulating layer 620 may be under the first touch line TL1 and the first insulating layer 610 and the third insulating layer 630 and the third touch line TL3 may be under the second insulating layer 620.

For example, the third touch line TL3 may be a line on the same layer as the data line DL, and may be a line to which a touch driving signal is applied. Alternatively, the third touch line TL3 may be a line that is electrically connected to the first touch line TL1 and the second touch line TL2 to reduce the resistance of the first touch line TL1 and the second touch line TL2.

The third insulating layer 630 may include a first region having a first height similar to the structure of the first insulating layer 610, and a second region having a second height lower than the first height. In addition, in the bent area, the third touch line TL3 may be in the second region of the third insulating layer 630. Thus, the third touch line TL3 in the bent area may be disposed in the pattern formed on the third insulating layer 630, so that a structure in which the third insulating layer 630 holds the third touch line TL3 may be formed.

When the third touch line TL3 is disposed in the pattern of the third insulating layer 630, the third touch line TL3 may have a structure resistant to cracking, even if the bent area is bent. Meanwhile, a structure for preventing a metal wire from being cracked in such a bent area may be applied not only to the touch lines TL, but also to the data line DL.

Figure 12:
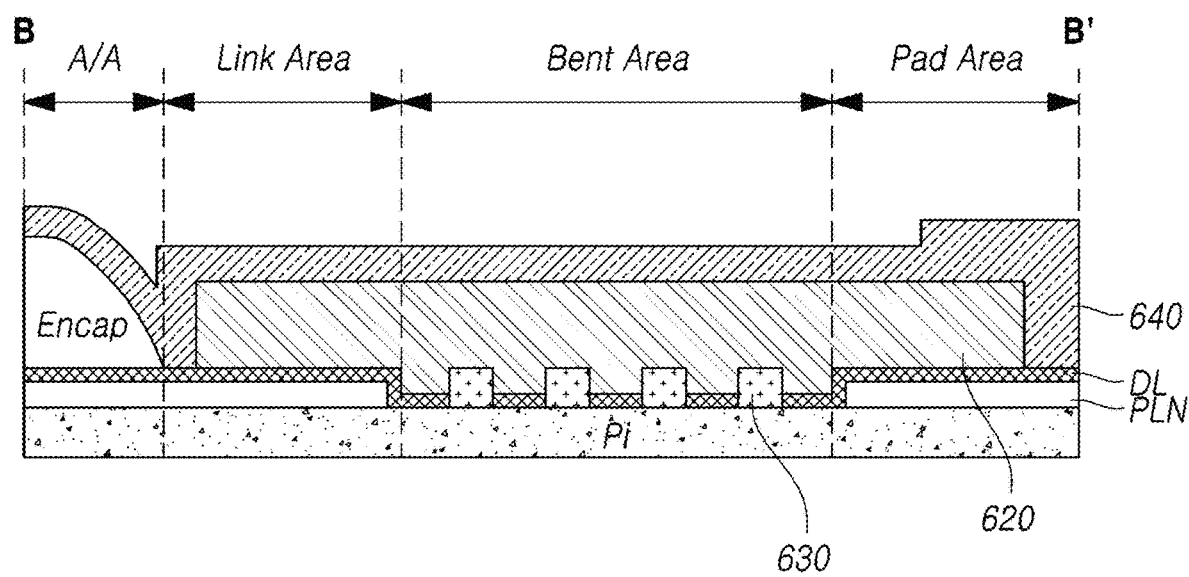
FIG. 12 illustrates an example of a case in which the structure of FIG. 8 is applied to the section of line B-B' in FIG. 5.

FIG. 12 illustrates an example of a case in which the structure of FIG. 8 is applied to the section of line B-B' in FIG. 5.

FIG. 12 illustrates an example of the structure of a data line DL disposed in the bent area in the touch display unit 100, and illustrates a case in which the structure of FIG. 8 is applied to the structure of the data line DL illustrated in FIG. 5. With reference to FIG. 12, in the non-active area N/A, the data line DL and the third insulating layer 630 may be under the second insulating layer 620.

The third insulating layer 630 may include a first region having a first height, and a second region having a second height lower than the first height. For example, the second region may be an opened area.

The data line DL may be in the second region of the third insulating layer 630 in the bent area. The thickness of the data line DL in the second region of the third insulating layer 630 may correspond to the difference between the first height and the second height. Alternatively, the thickness of the data line DL may be smaller than the difference between the first height and the second height.

In the bent area, when the data line DL is disposed in the pattern formed on the third insulating layer 630, the third insulating layer 630 may form a structure that holds the data line DL. Therefore, occurrence of cracks in the data line DL can be reduced through the structure disposed in the pattern of the third insulating layer 630, even if the data line DL is bent in the bent area.

Embodiments of the present disclosure may provide, in a touch display panel and a touch display device, a structure in which a pattern may be formed in an insulating layer in a bent area and a metal wire may be disposed in the pattern such that the insulating layer may hold the metal wire. Accordingly, even if the metal wire is bent according to the bent shape of the bent area, it may be possible to reduce the occurrence of cracks in the metal wire by the force of holding the metal wire in the insulating layer and to provide a robust metal wire structure in the touch display device including the bent area.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A touch display device, comprising:
   an active area;
   a non-active area outside the active area, the non-active area comprising a bent area;
   a plurality of touch electrodes in the active area;
   a first insulating layer in the bent area, the first insulating layer comprising:
      a first region having a first height; and
      a second region having a second height lower than the first height; and
   a first touch line in the second region of the first insulating layer in the bent area in the non-active area,
   wherein an upper portion of the first region of the first insulating layer is higher than an upper portion of the first touch line on the second region of the first insulating layer in a cross-sectional side view, and
   wherein a second insulating layer on the first insulating layer and the first touch line and having at least a portion disposed from the upper portion of the first region of the first insulating layer to the upper portion of the first touch line in the second region of the first insulating layer; and
   a second touch line below the first insulating layer and overlapping the first touch line.

2. The touch display device of claim 1, wherein the second region, having the second height in the first insulating layer, is an opened area.

3. The touch display device of claim 1, wherein a thickness of the first touch line is less than or equal a difference between the first height and the second height.

4. The touch display device of claim 1, wherein the second touch line is electrically connected to the first touch line at one or more points in the non-active area.

5. The touch display device of claim 1, further comprising: a metal wire below the second insulating layer below the second touch line, the metal wire being electrically connected to the second touch line at one or more points in an area other than the bent area in the non-active area.

6. The touch display device of claim 5, further comprising:
   a third insulating layer below the metal wire,
   wherein the metal wire is disposed along a side face and an upper face of the third insulating layer.

7. The touch display device of claim 5, further comprising:
   a third insulating layer under the second insulating layer, the third insulating layer comprising an opened area,
   wherein the metal wire is in the opened area of the third insulating layer.

8. The touch display device of claim 5, further comprising:
   a data line,
   wherein the metal wire is on a same layer as the data line in the bent area.

9. The touch display device of claim 1, wherein, in the bent area, the first touch line comprises:
   a first portion having a zigzag shape; and
   a second portion having a zigzag shape and intersecting the first portion.

10. The touch display device of claim 1, wherein:
    the plurality of touch electrodes are on an encapsulation layer in the active area; and
    the plurality of touch electrodes are electrically connected to the first touch line in the bent area.

11. A touch display panel, comprising:
    an active area comprising a plurality of touch electrodes;
    a non-active area outside the active area, the non-active area comprising a bent area;
    an insulating layer in the bent area, the insulating layer comprising:
       a first region having a first height; and
       a second region having a second height lower than the first height;
    a first metal wire in the second region of the insulating layer in the bent area in the non-active area, an upper portion of the first region of the insulating layer being higher than an upper portion of the first metal wire on the second region of the insulating layer in a cross-sectional side view;
    a protective layer on the insulating layer and the first metal wire and having at least a portion disposed from the upper portion of the first region of the insulating layer to the upper portion of the first metal wire in the second region of the insulating layer; and
    a second metal wire below the insulating layer and overlapping the first metal wire.

12. The touch display panel of claim 11, wherein a thickness of the first metal wire is less than or equal to a difference between the first height and the second height.

13. The touch display panel of claim 11, wherein the second region, having the second height in the insulating layer, is an opened area.

\* \* \* \* \*